United States Patent [19]

Gobin et al.

[11] Patent Number: 5,086,274

[45] Date of Patent: Feb. 4, 1992

[54] VARIABLE FREQUENCY MAGNETIC FIELD DEVICE EMPLOYING MULTIPLE ANTENNAE FOR MEASURING THE SURFACE IMPEDANCE OF A MATERIAL

[75] Inventors: Vincent Gobin, Chatenay Malabry; Gérard Labaune, Palaiseau; Francois Issac, Nanterre, all of France

[73] Assignees: Office National d'Etudes et de Recherches Aerospatiales, Chatillon; Avions Marcel Dassault-Breguet Aviation (AMD/BA), Vaucresson, both of France; a part interest

[21] Appl. No.: 535,498

[22] Filed: Jun. 11, 1990

[30] Foreign Application Priority Data

Jun. 12, 1989 [FR] France .................................. 89 07726

[51] Int. Cl.$^5$ ...................... G01R 33/12; G01N 27/72
[52] U.S. Cl. ................................. 324/239; 324/230; 324/232; 324/242; 324/243; 324/262
[58] Field of Search .................... 324/202, 207.17, 225, 324/229–234, 236–243, 262

[56] References Cited

U.S. PATENT DOCUMENTS

| | | | |
|---|---|---|---|
| 2,629,004 | 2/1953 | Greenough | 324/230 X |
| 3,441,840 | 4/1969 | Randle | 324/230 X |
| 3,764,897 | 10/1973 | Greenwood | 324/229 |
| 3,848,183 | 11/1974 | Puidak | 324/243 |
| 3,936,734 | 2/1976 | Brandli et al. | 324/233 X |
| 4,042,876 | 8/1977 | Visioli, Jr. | 324/207.16 |
| 4,706,020 | 11/1987 | Viertl et al. | 324/262 X |

Primary Examiner—Gerard R. Strecker
Attorney, Agent, or Firm—Fleit, Jacobson, Cohn, Price, Holman & Stern

[57] ABSTRACT

A surface impedance measurement device comprises a transmitting antenna producing a magnetic field in the area surrounding a material to be tested and a receiving antenna receiving the magnetic field. An electric voltage wobbled in frequency is applied to the transmitting antenna, and a circuit measures the voltage at the terminals of the second antenna. For the antennae to be applied on the same side of the material to be tested and of which the surface impedance is to be measured, the antennae are superposed by the intermediary of a dielectric wedge in a compact probe. The impedance measurements are then independent of the dimensions and geometry of the material.

11 Claims, 12 Drawing Sheets

VARIABLE FREQUENCY MAGNETIC FIELD DEVICE EMPLOYING MULTIPLE ANTENNAE FOR MEASURING THE SURFACE IMPEDANCE OF A MATERIAL

BACKGROUND OF THE INVENTION

1. Field of the Invention.

This invention relates to a measurement device called impedancemeter for measuring the surface impedance of a material.

More particularly, the invention deals with materials that are very good conductors electrically, presented in the form of a thin sheet, such as the conductive metals or compound materials, e.g. with carbon fiber, used in aeronautic equipment. These materials can, if necessary, be covered with paints or insulation coatings.

2. State of the Prior Art.

It is recalled that the surface impedance $Z_S$ characterizing such materials results from the following definition. The material carries a surface current density $J_s$ which creates a potential difference per unit of length represented by the longitudinal electrical field $E_{tg}$. The impedance $Z_S$ is defined by the relation: $E_{tg} = Z_S J_s$.

In the case of the material being conductive, the impedance $Z_S$ is related to the electrical conductivity $\sigma$ and to the thickness d of the material by the relation $Z_S = 1/(\sigma d)$ as long as there is no occurrence of skin effect. If we consider a square plate of impedance $Z_S$ carrying a current I, a potential difference V appears at the terminals of the plate such that $V = Z_S I$.

The preceding remark can be turned to good account to measure the surface impedance $Z_S$ directly. Nevertheless, with a very conductive material, the impedance of the material is in series with the impedance of the wires that inject the current I. It is then no longer possible to distinguish the contribution of the material and that of the measuring circuit in the measuring of the potential difference V, which then becomes impossible. Moreover, such measurement cannot be carried out if the material is covered with non-conductive material.

To obviate this drawback, it has already been proposed that the impedance $Z_S$ be measured without any electrical contact between an impedancemeter and the material.

A known impedancemeter further comprises a first antenna, called transmitting antenna, that creates a given electromagnetic field, and a second antenna, called receiving antenna. A measurement chain connected to the second antenna enables the electromagnetic field to be measured in a given frequency band. During a first stage, the transmitting antenna is placed at a predetermined constant distance from the receiving antenna and is moved away from material likely to perturb the field emitted directly by the first antenna and received by the second antenna. During a second stage, a sample of the material to be tested is interposed between the transmitting and receiving antennae. Throughout the two stages, an alternating voltage wobbled in a predetermined frequency range is applied to the transmitting antenna. The voltage measurements at the terminals of the receiving antenna for the two stages are analyzed and interpreted in order to determine the surface impedance value $Z_S$ of the material sample.

The material usually fills a two-dimensional opening in a metallic panel of large dimensions. Each of the antennae is comprised of a conductive circular loop attached to an insulating holder plate on both sides of the opening plane.

The transmitting antenna creates a magnetic field that is uniform with the area surrounding the material parallel to the plane of the material. During the first stage, the receiving antenna receives a magnetic field from the other side of the opening at a given distance. During the second stage, the receiving antenna receives a magnetic field that is attenuated by the presence of the material in the opening.

In the case of a circular opening of radius a, the ratio of the measured voltages $V_o$ and $V$ between the terminals of the receiving antenna during the first and second stages satisfy the approximate relation:

$$V/V_o = 1/(1 + jf/f_c)$$

with $f_c = (3Z_S/(8\mu_o a))(1 + 2\pi R_c/Z_S)$
whereby $Z_S$ is the surface impedance of the material, a is the radius of the opening, $R_c$ is the possible resistance of the joint connecting the material and the metallic panel, and $\mu_0 = 4\pi.10^{-7}$ H/m is the permeability of vacuum.

If the electrical contact between the material and the metallic panel in the opening is perfect, i.e. if $R_c = 0$, we obtain $f_{CO} = 3Z_S/8\mu_o a$.

In this way, the fixing of the material in the opening provokes in the voltage picked up by the receiving antenna an attenuation or transfer function of the "first-order low-pass filter" type characterized by a cut-off frequency $f_{CO}$ proportional to the surface impedance $Z_S$ of the material.

The known impedancemeter with two completely separate antennae and the measurement method inherent in this device mainly have the three following drawbacks:

i) The expression of $f_C$ shows that if the material-conductive panel contact is not perfect, the frequency $f_C$ is shifted with regard to $f_{CO}$. As the value of $R_c$ cannot be quantified, an assembly must be set up to attempt to minimize the interference resistance $R_c$. The value of the latter is then neglected in the interpretation of the measurement, without it being possible to evaluate the error made. Furthermore, a sample material covered with paint cannot be measured as the contact is bad.

ii) The frequency $f_c$ depends on the radius a of the opening, i.e. on the dimension of the sample material tested. Only materials cut out to a given format so as to fix them in the opening can be tested by this method. It is therefore necessary to cut out a sample of each material to be tested, and a material belonging to a complex structure cannot be tested.

iii) The distance between the transmitting antenna and the material must be sufficient to obtain a magnetic field that is uniform with the area surrounding the material. As a result, the distance between the antennae is relatively long and the voltage measured by the receiving antenna is relatively low.

OBJECTS OF THE INVENTION

The main object of this invention is to obviate the disadvantages of the prior art as commented above.

Another object of this invention is to provide a surface impedance measurement device wherein the two antennae are placed on the same side of the material to be tested.

A further object of this invention is to enable measurements without electrical contact between the surface impedance measurement device and the material, but also measurements that are independent of the dimensions and geometry of the material to be tested.

SUMMARY OF THE INVENTION

The invention requires antennae, with a known geometry, preferably in the form of conductive circular loops.

Accordingly, a device for measuring the surface impedance of a material to be tested comprises a first antenna producing a magnetic field in the area surrounding the material, a second antenna receiving the magnetic field, means for deriving an electrical voltage wobbled in frequency to terminals of the first antenna, and voltage measuring means for measuring the voltage between terminals of the second antenna. The first and second antennae are superposed by the intermediary of a dielectric material in a compact probe to be applied near a same side of said material to be tested.

According to a first embodiment, the probe comprises a wedge (also hereinafter referred to as a spacing member) in dielectric material, and two thin boards (also hereinafter referred to as support members) in dielectric material that are respectively fixed on two parallel sides of said wedge and on which are printed the first and second antennae respectively. The wedge and printed boards assembly is coated and protected by an exterior dielectric layer. Then, the two antennae are maintained parallel at a constant distance. The second antenna, called receiving antenna, can be applied to the material to be tested and against which the receiving antenna is insulated by the thin layer of dielectric coating. The second antenna therefore only picks up magnetic field emitted by the first antennae and perturbed by the material.

According to a second embodiment, the probe comprises a third antenna receiving said magnetic field and superposed above the first antenna opposite the second antenna. In this embodiment, the voltage measuring means simultaneously measures a first voltage between the terminals of the second antenna and a second voltage between the terminals of the third antenna. By comparison with the first embodiment, measurement by means of this second embodiment is much faster.

This probe with three antennae further comprises
first, second and third thin boards in dielectric material which respectively support the first, second and third antennae,
a first wedge in dielectric material against two parallel sides of which the first and second boards are respectively fixed, and
a second wedge in dielectric material against two parallel sides of which the first and third boards are fixed.

The measurement device also comprises, particularly according to this second embodiment, means for calculating the variation of the ratio between said first and second voltages as a function of the frequency when said probe is moved away from said material to be tested and subsequently when said probe is placed on a same side of said material to be tested, thereby detecting from it the surface impedance of said material to be tested by seeking out, among stored low-pass-type reference curves, a reference curve nearest the variation of said ratio between said voltages.

BRIEF DESCRIPTION OF THE DRAWINGS

Further features and advantages of the invention will be apparent from the following particular description of several preferred embodiments of this invention as illustrated in the corresponding accompanying drawings in which.

DESCRIPTION OF THE PREFERRED EMBODIMENTS

Figure 1:
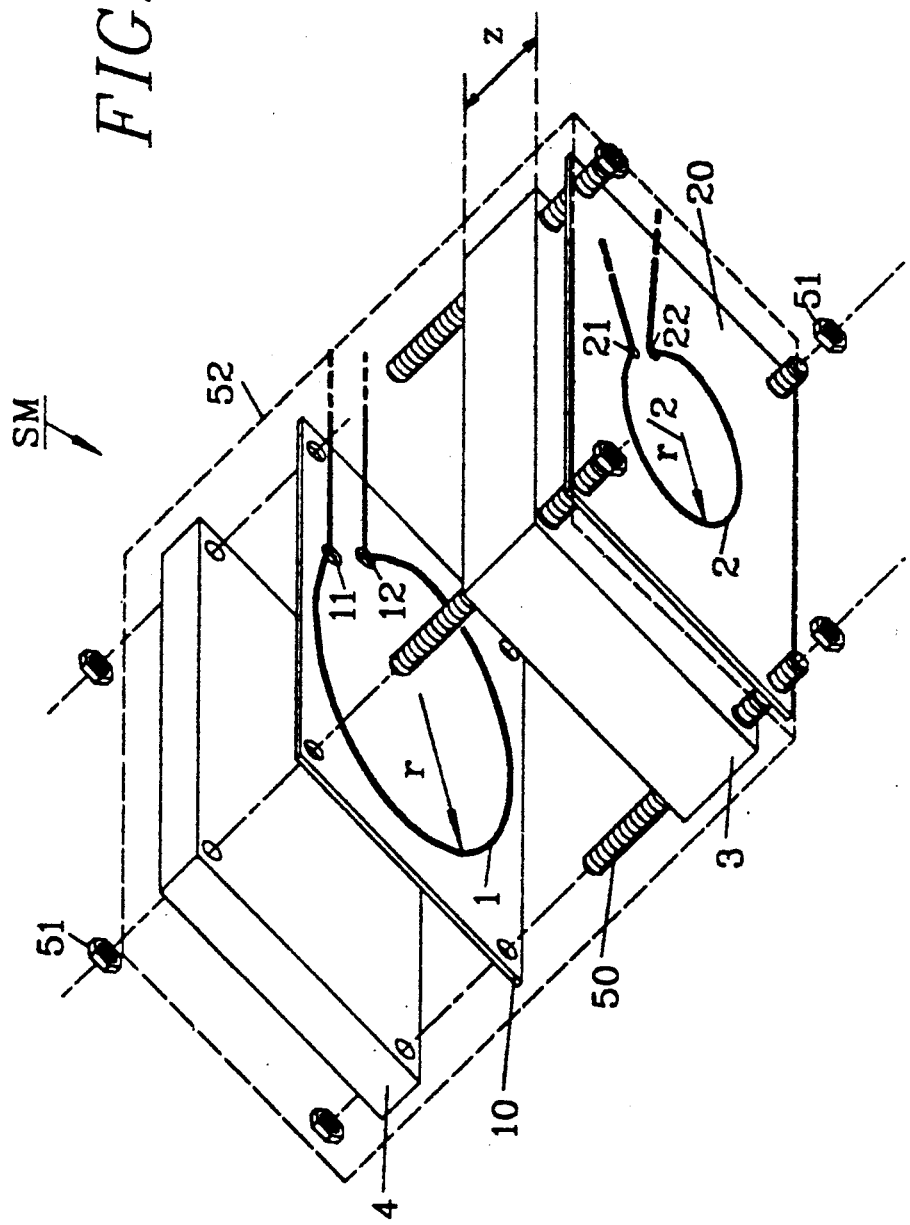
FIG. 1 is an exploded view in perspective of a first probe with two antennae embodying the invention.

A measurement probe SM for impedancemeter embodying the invention and shown in FIG. 1 comprises an injection antenna 1 playing the role of a transmitting antenna, and a measuring antenna 2 playing the role of receiving antenna and placed parallel to the first antenna 1. Each of the antennae 1, 2 is typically comprised of a circular spire printed on one of the sides of an insulating board 10, 20, or by two concentric circular spires printed on the sides of a two-sided printed board. However, the second antenna may be rectangular or of any other form. The neighboring terminals 11 and 12, 21 and 22 of the antenna 1, 2 are comprised of metallized holes in the board 10, 20, from which printed connection conductors can be extended.

According to the embodiment illustrated in FIG. 1, the elements 20, 3, 10 and 4 have a same square-shaped section and are maintained in a stack by means of four through screws and nuts 50 and 51. The elements thus stacked 20, 3, 10 and 4 are then coated with a thin protective dielectric layer 52 such as epoxy resin. Typically, if r designates the radius of the transmitting antenna 1, the radius of the receiving antenna 2 is equal to r/2, and the thickness z of the insulating wedge 3 is equal to r.

Figure 2:
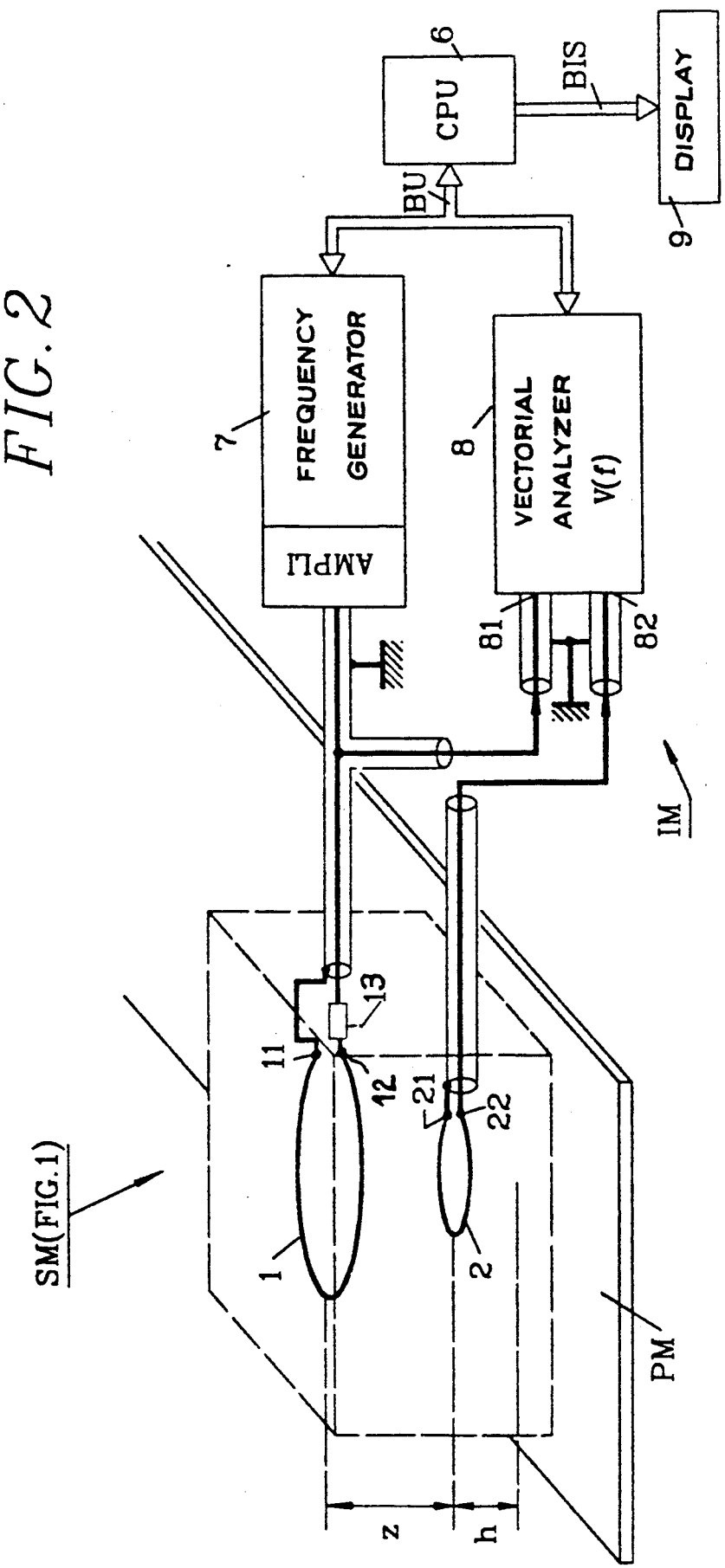
FIG. 2 is a block diagram of an impedancemeter embodying the invention, operating with the probe in FIG. 1.

As shown in FIG. 2, to take surface impedance measurements relating to a good electrical conductive material to be tested, a thin plate PM of said material is used as a sample. The probe SM is placed above the plate in such a way that the receiving antenna 2 is facing the plate and that the axis of the antennae 1 and 2 is substantially perpendicular to the plate PM. In this way, the receiving antenna 2 and its holder board 20 are at a distance h from the plate of material PM which can practically vary from 0, plus the small thickness of the coating 52, to several millimeters. On the other hand, the inter-antenna gap, substantially equal to the thickness z of the wedge 3, is constant.

Furthermore, the antennae 1 and 2 are connected to electronic circuits of the impedancemeter IM proper. The latter is organized around a central processing unit (CPU) 6 comprising a preprogrammed microprocessor. The unit 6 is connected by an internal bidirectional bus BU to a frequency generator 7 and a vectorial analyzer 8, and by a standard interface bus BIS to a measurement result display device 9 comprising e.g. a printer.

Outputs of the generator 7 are connected to the terminals 11 and 12 of the transmitting antenna 1 via an impedance matching load 13 which is also printed on the holder board 10. Generator 7 produces a wobbled alternating voltage signal of which the frequency f periodically sweeps a frequency range $f_{min}$ to $f_{max}$ selected by the processing unit 6. The voltage signal produced by the generator 7 is converted to an electric current in the transmitting antenna 1 which then creates an induced current in the second antenna 2 and consequently an induced voltage at the terminals 21 and 22. This induced voltage is equal to the time derivative of the flux of the magnetic field crossing the receiving antenna 2.

The analyzer 8 has inputs 81 and 82 respectively connected to the output terminals 12 and 22 of the antennae 1 and 2 so as to measure the voltage produced by the generator 7 on the antennae 1 and the voltage induced in the antenna 2, at each frequency. These voltages are read in digital form by the unit 6.

The measurement of the surface impedance $Z_S$ of the material to be tested is carried out in two stages.

During a first stage, the probe SM is placed at a distance from all materials in such a way that the magnetic field directly crossing the receiving antenna 2 is not perturbed by any material. The analyzer 8 measures a voltage $V_d(f)$ directly induced in the antenna 2. The unit 6 memorizes each of the values of $V_d(f)$ as a function of the frequency f.

During a second stage, the probe SM is placed above the material PM, as previously described in reference to FIG. 2, and is maintained at a constant distance h that does not exceed a few millimeters. The distance h is preferably as small as possible, i.e. almost equal to zero, as will be seen hereinafter. The analyzer 8 measures a voltage $V_m(f)$ induced in the antenna 2 by the antenna 1. The voltage $V_m$ results from the magnetic flux produced by the antenna 1 and perturbed by the plate of the material PM near the antenna 2. The unit 6 memorizes each of the values of $V_m(f)$ as a function of the frequency f, and calculates the ratio $S(f) = V_m/V_d$ lower than one, expressed in the form 20 log S(f) with a view to representing its variations as a function of the frequency f in the display device 9.

The voltage measured on the antenna 1 enables checking the stability of the signal derived by the generator 7 during first and second stages.

Theoretically, it is shown that the voltage ratio S is equal to the sum of two coefficients $S(f) = S_1 + S_2(f)$, one of which $S_1$ is independent of the frequency. The coefficients $S_1$ and $S_2$ are expressed as a function of the ratios z/r and h/r:

$$S_1 = 1 - \frac{(1 + (z/r)^2)^{3/2}}{(1 + (z/r + 2h/r)^2)^{3/2}}$$

$$S_2 = (1 + (z/r)^2)^{3/2} \int_0^\infty \frac{u^2}{(u + jf/f_{co})} J_1(u) e^{-u(z/r + 2h/r)}$$

whereby $J_1(u)$ is the Bessel function of order 1, $f_{CO}$ is a characteristic frequency such that $f_{CO} = Z_S/(\pi\mu_0 r)$, and $\mu_0 4\pi.10^{-7}$ H/m is the permeability of vacuum. It appears that the coefficient $S_1$ depends only on the geometric parameters z/r and h/r and is independent of the measurement frequency f, and that the coefficient $S_2$ depends on z/r, h/r, $f_{CO}$ and on the frequency f.

The function S(f) is now mainly analyzed as a function of the distance h between the probe SM and the material PM in order to present the advantages of the choice h~0 when the impedancemeter is used.

In the case of h=0, the probe SM is applied directly to the material PM. The coefficient $S_1$ is then equal to 0 and the voltage ratio S is reduced to:

$$S = S_2 [1 + (z/r)^2]^{3/2} \int_0^\infty \frac{u^2}{u + jf/f_{co}} J_1(u) e^{-u(z/r)} du$$

The ratio S only depends on the geometric parameter z/r, on the characteristic frequency $f_{CO}$ which is proportional to the surface impedance $Z_S$ of the material, and on the measurement frequency f. The function S can then be calculated digitally.

Figure 3:
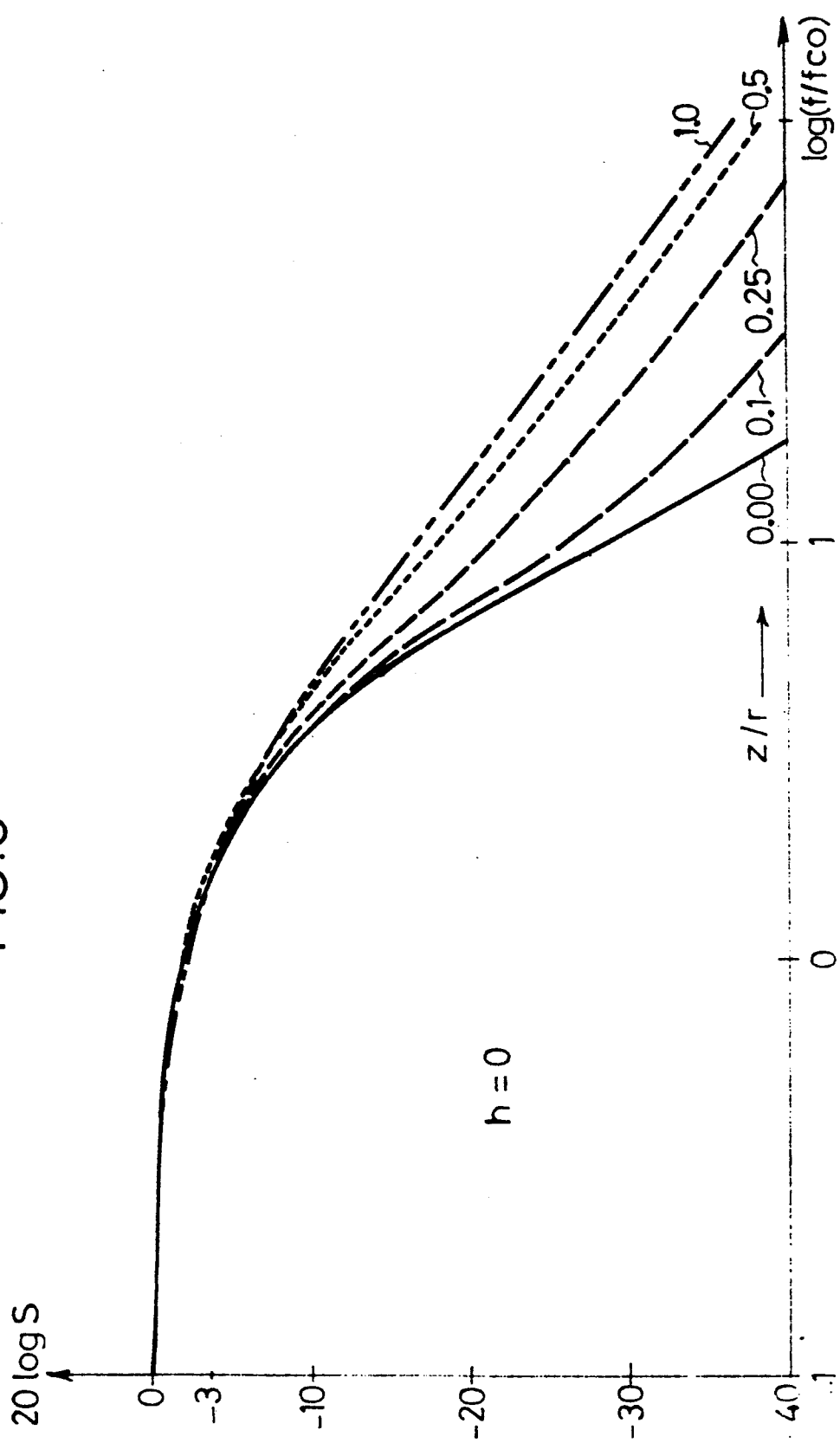
FIGS. 3 and 4 are charts showing antenna voltage ratio variations as a function of frequency, particularly for probes with different inter-antenna gaps, when these probes are applied to a same material to be tested.
Figure 4:
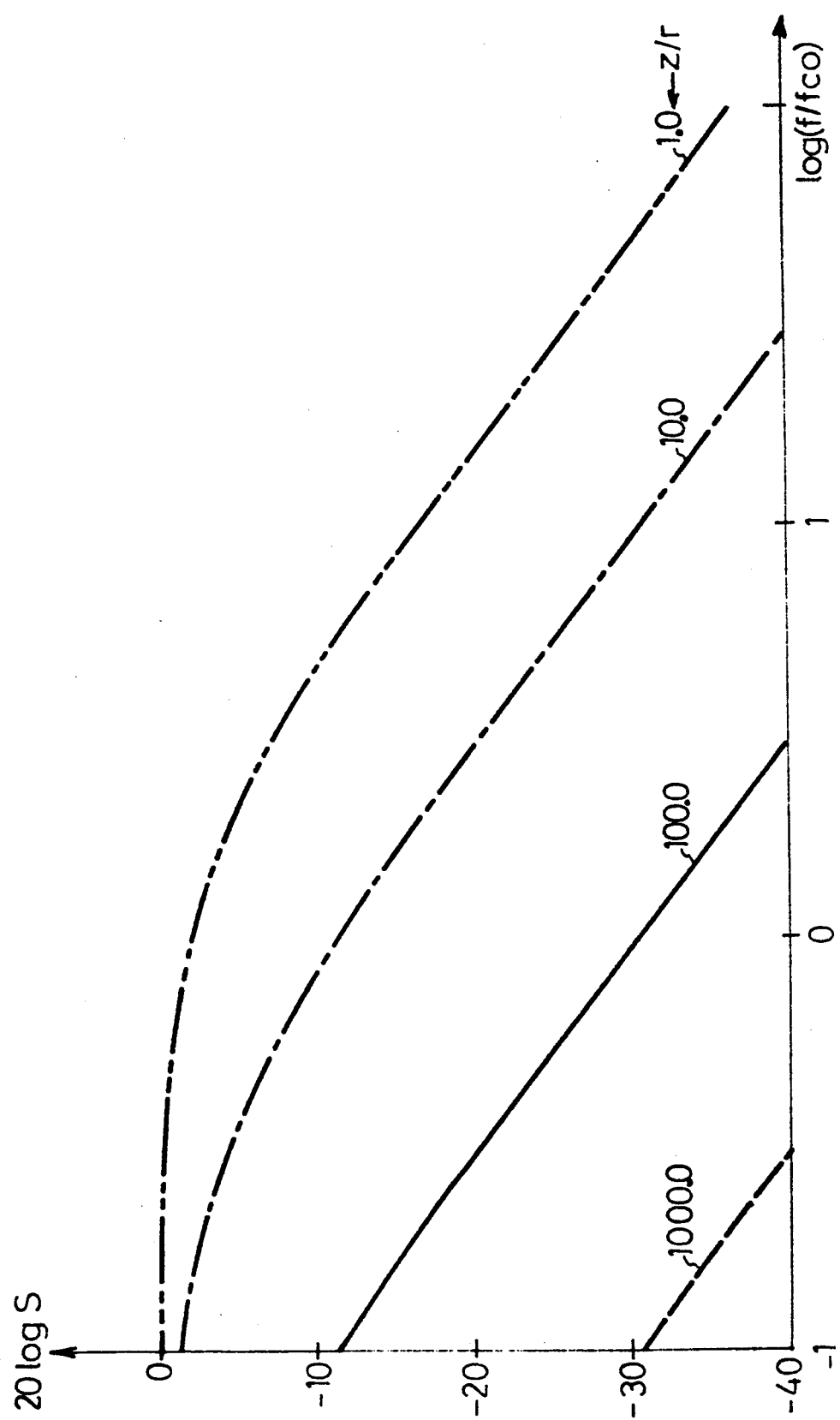

FIGS. 3 and 4 show the variation of S expressed in dB as a function of $\log(f/f_{CO})$ for several values of z/r equal to 0.0; 0.1; 0.25; 0.5; 1.0; 10.0; 100.0 and 1000.0.

The ratio S varies like a low-pass type function of which the form and particularly the slope at high frequencies depend on z/r. In this way, for a geometry of the probe SM determined by constant parameters, the position of the variation curve of S compared with the frequency axis is directly related to $Z_S$. During measurement, as will be seen hereinafter, the processing unit 6 seeks out one of the low-pass type theoretical curves as close as possible to the variation curve of S corresponding to the material to be tested and obtained by the measurement proper, and identifies the position of the variation curve of S as a function of the frequency f in the range [$f_{min}, f_{max}$] by one or several characteristic points, e.g. at 3 dB, 10, 20 and 30 dB, in order to determine $Z_S$.

For z/r varying from 0 to 1 as per FIG. 3, the form of the variation curve of S gradually changes from a second-order curve at approximately 40 dB/decade to a first-order curve at approximately 20 dB/decade, the cut-off frequency which is usually chosen at 3 dB varying little. For z/r varying above 1 as per FIG. 4, the function S is little different to a first-order low-pass function, the cut-off frequency at 3 dB moving towards the lower frequencies.

In this way, though any value of z/r will do to measure the surface impedance $Z_S$, the invention recommends that the geometric parameter z/r be chosen and consequently the geometry of the probe according to the following two criteria.

The voltage induced between the terminals 21 and 22 of the second antenna 2 is proportional to the time derivative of the magnetic flux crossing it and consequently to the frequency f. To extend measurement to the lower frequencies, there must be sufficient flux and consequently sufficient induced voltage, which implies good coupling between the antennae 1 and 2 and quite a small inter-antenna gap z.

Figure 5:
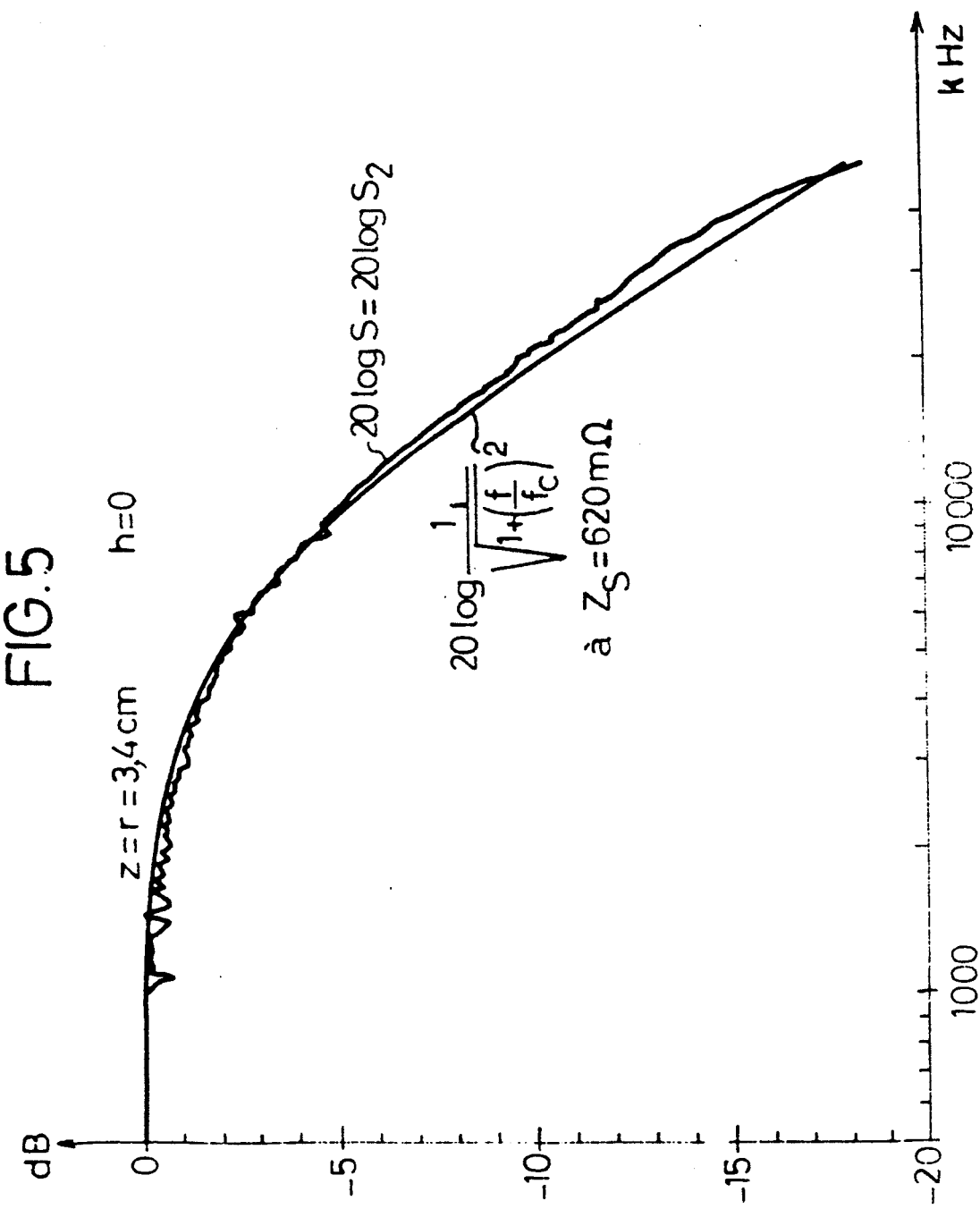
FIGS. 5 and 6 are charts showing variations of said antenna voltage ratio as a function of frequency, obtained with a same probe and two different materials respectively, and theoretical curves close to the "low-pass filter" type.
Figure 6:
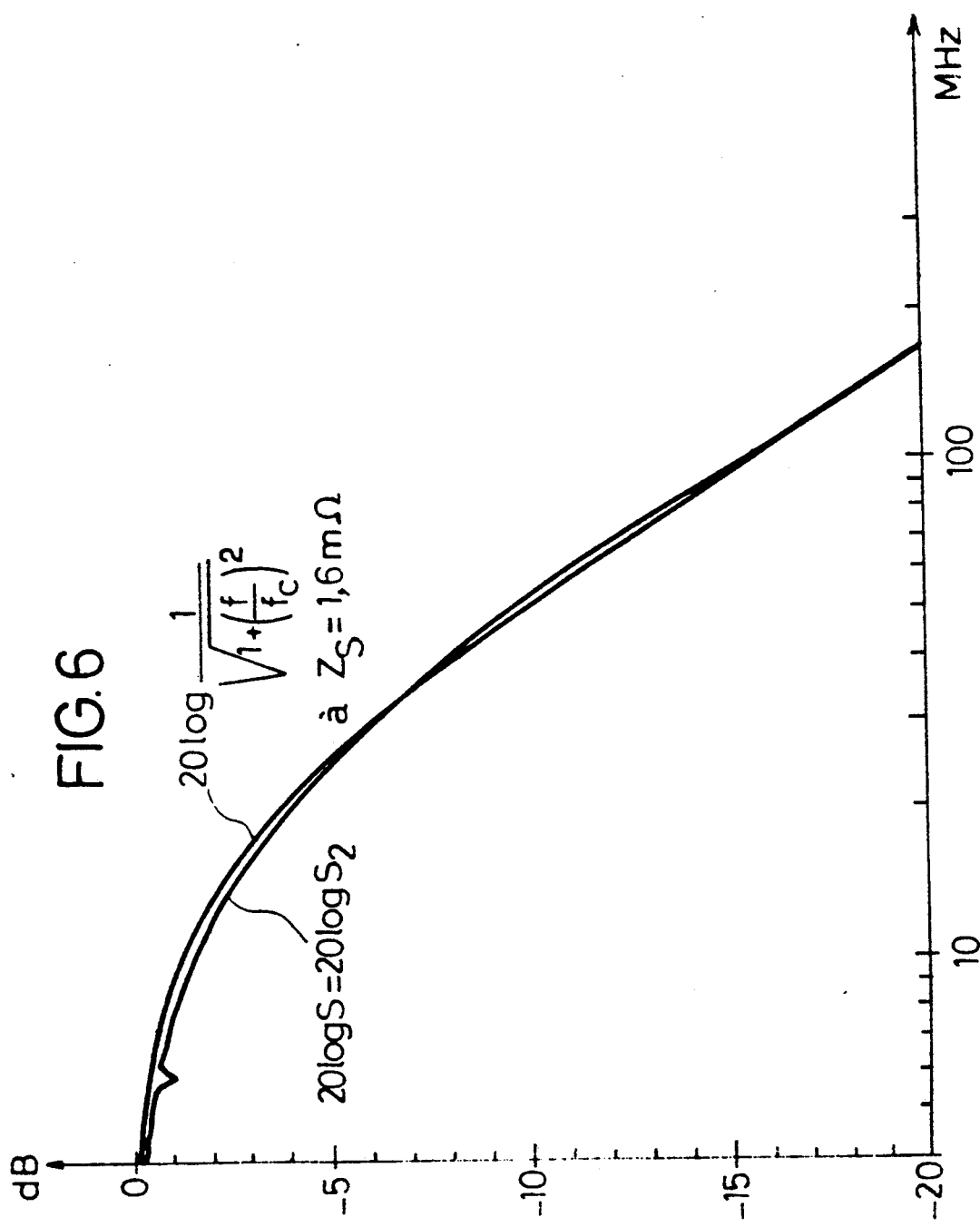

In order to determine the impedance $Z_S$, the unit 6 locates the position of the variation curve of S measured in relation to at least one given straight line parallel to the frequency axis since, for a given value of S, there is only one value of $Z_S$ and consequently of $f_{CO}$ corresponding to a ratio $f/f_{CO}$. It is therefore preferably that the unit 6 identify a "simple" curve. According to the invention, the unit 6 seeks out by successive approximations a low-pass function of the first order nearest the function S(f) obtained on measuring. For instance, the particular case $z/r=1$ is suitable; FIGS. 5 and 6 show that the function S(f) obtained after measurement is little different to the function $$FBP = (1 + (f/f_C)^2)^{-\frac{1}{2}}$$

whereby $fc \sim 1.4\ fco = 1.4\ Z_S/(\pi\mu_0 r)$

Figure 7:
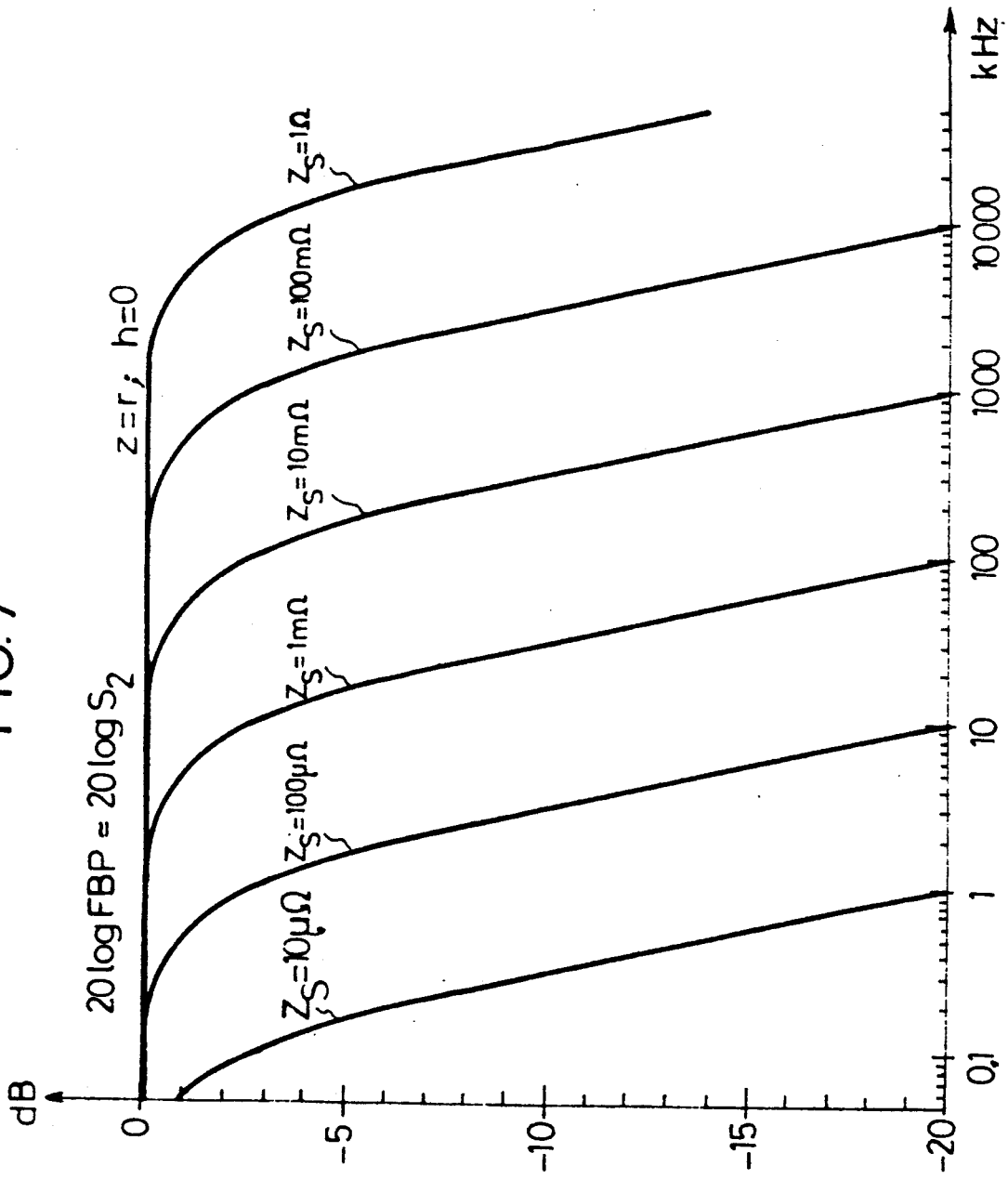
FIG. 7 shows theoretical curves of the "low-pass filter" type for various surface impedance values.

FIG. 7 shows different curves FBP(f) for various values of $Z_S$ and shows that the smaller the impedance $Z_S$, the more the measurements are taken in the low frequencies.

In this way, to determine the impedance $Z_S$ of a material with a probe SM such that $z=r$, the unit 6 identifies the curve S(f) for several predetermined values of S or of f, calculates the standard deviation between the curve S(f) and the various functions FBP(f) corresponding to values of $f_C$, and only retains the function FBP with the smallest standard deviation. The impedance of the material $Z_S = \pi\mu_0 r\ f_C/1.4$ is then deduced from the retained function FBP and consequently from the corresponding characteristic frequency $f_C$.

In the case of $h \neq 0$, i.e. when the probe SM is not applied to the plate of material PM, the coefficient $S_1$ is no longer zero but is equal to a constant for a given geometry and a predetermined position of the probe SM, i.e. for constant $z/r$ and $h/r$. The second coefficient $S_2$ is always a low-pass type function tending towards 0 when f tends towards infinity. The ratio $S = S_1 + S_2$ is therefore approximately equal to $S_2$ at low frequency and to $S_1$ at high frequency.

Figure 8:
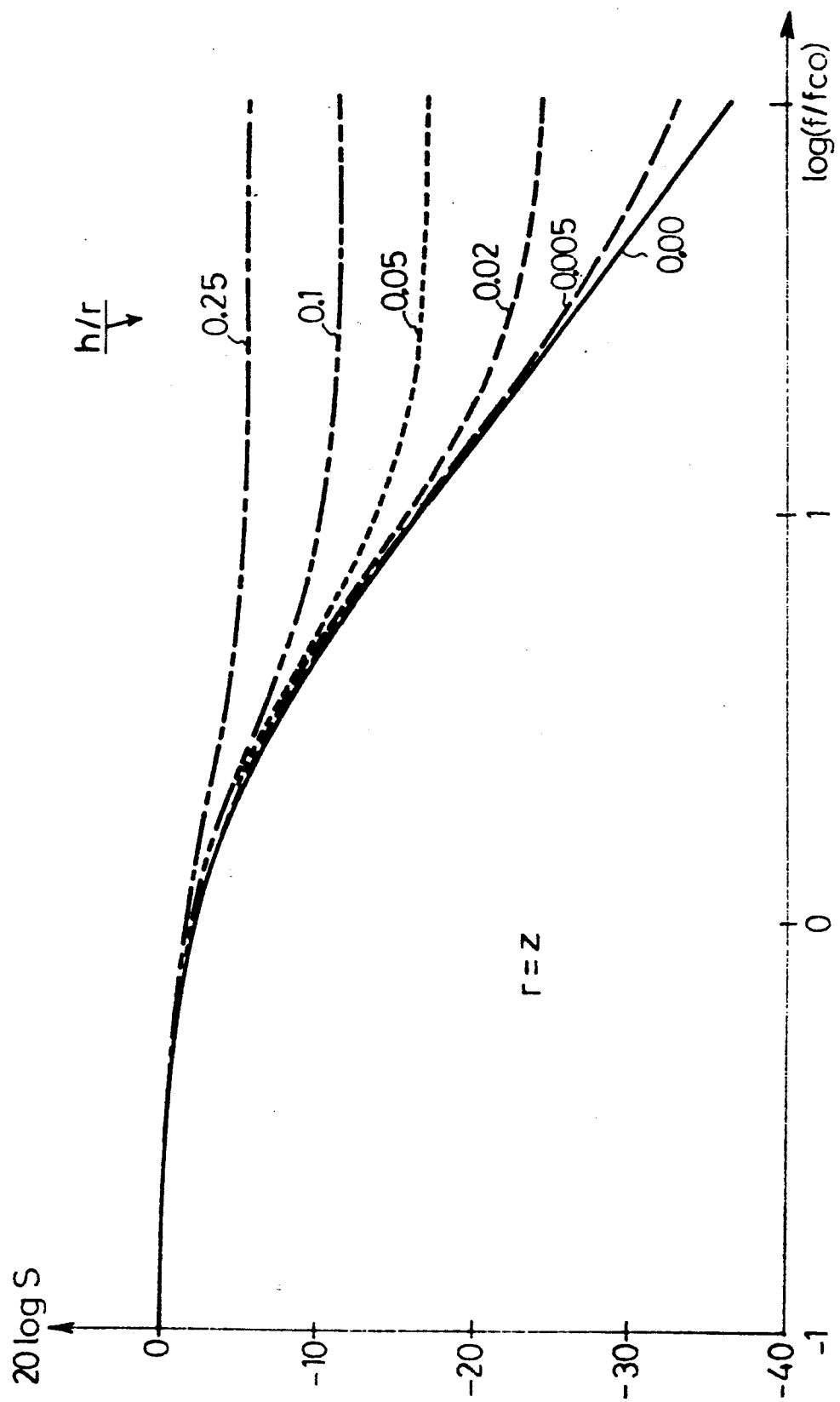
FIG. 8 is a chart showing variations of said voltage ratio as a function of frequency, obtained with a same probe and for a same material, but for different distances between the probe and the material.

FIG. 8 shows the filtering function S as a function of the frequency f for several values of the distance h between the probe SM and the material PM, when the inter-antenna gap is constant and equal to $z=r$. The beginning in low frequency of the curves in FIG. 6 is little different to the case $h=0$ as per FIGS. 4 and 5. At high frequency, the curves in FIG. 8 tend towards respective planes equal to $S_1(h/r)$.

When seeking to determine the surface impedance Zs, h should be as small as possible since major dynamics are sought to identify the form of the curve S(f) obtained during measurement.

On the other hand, the value of maximum attenuation $S_1$ only depends on h for constant $z/r$ and is independent of the impedance of the material. The curve $S_1(h)$ can be used to experimentally determine the distance between the probe and a conductive material, this distance being e.g. equal to the thickness of an insulation coating covering the material.

The measurement method implemented by the impedancemeter enables the surface impedance $Z_S$ of a conductive material to be evaluated. However, for a homogeneous material, from the formula $Z_S = 1/(\sigma, d)$, if $\sigma$ is known, the thickness of the material $d = 1/(Z_S\sigma)$ is deduced, and if d is known, the conductivity of the material $(\sigma = 1/(Z_S d))$ is deduced.

A probe SM for which $z \sim r = 5$ cm, imposes a characteristic frequency $$fc \sim 1.4 Z_S/(\pi\mu_0 r) \sim 2.10^7 Z_S$$

Supposing a frequency sweep from 0 up to a predetermined maximum frequency $f_{max}$, the surface impedance measured will be less than $Z_{S\ max} = f_{max}/(2.10^7)$, i.e. for instance $Z_{S\ max} = 0.5\ \Omega$ for $f_{max} = 10$ MHz, and $Z_{S\ max} = 5\ \Omega$ for $f_{max} = 100$ MHz.

In this way, the impedancemeter with the probe embodying this example measures surface impedances of less than a few ohms.

It should be noted that the higher the impedance measured, the lower the frequency at which the measurement must be carried out, as per FIG. 7. As previously stated, the voltage measured via the receiving antenna 2 is proportional to the product of the flux crossing it and the frequency. The flux emitted by the first antenna 1 must therefore be increased in order to carry out measurements at low frequency. The transmitting antenna is no longer comprised of a single spire but of a winding of n spires, and the sensitivity of the probe is then increased by the integer factor n. In this instance, the board 10 has several concentric spires on one or both sides, or is replaced by a multilayer circuit, each layer comprising at lest one spire. According to another embodiment which can be implemented alone or combined with the previous solution, an amplifier is provided at output of the frequency generator 7 for amplifying the current in the transmitting antenna 1 and the magnetic flux and subsequently the sensitivity of the probe SM.

The measurement method described above and implemented by the impedancemeter IM equipped with the probe as per FIG. 2 is comprised of two successive stages: a calibration of the probe at a distance from all materials during the first stage, then measurement of the surface impedance by applying the probe SM to the material PM during the second stage.

To increase measurement speed, the calibration stage is carried out simultaneously with the measurement stage, at each frequency value, by using a probe SMa with a transmitting antenna 1 and two receiving antennae 2a and 2R, and a corresponding impedancemeter IMa.

Figure 9:
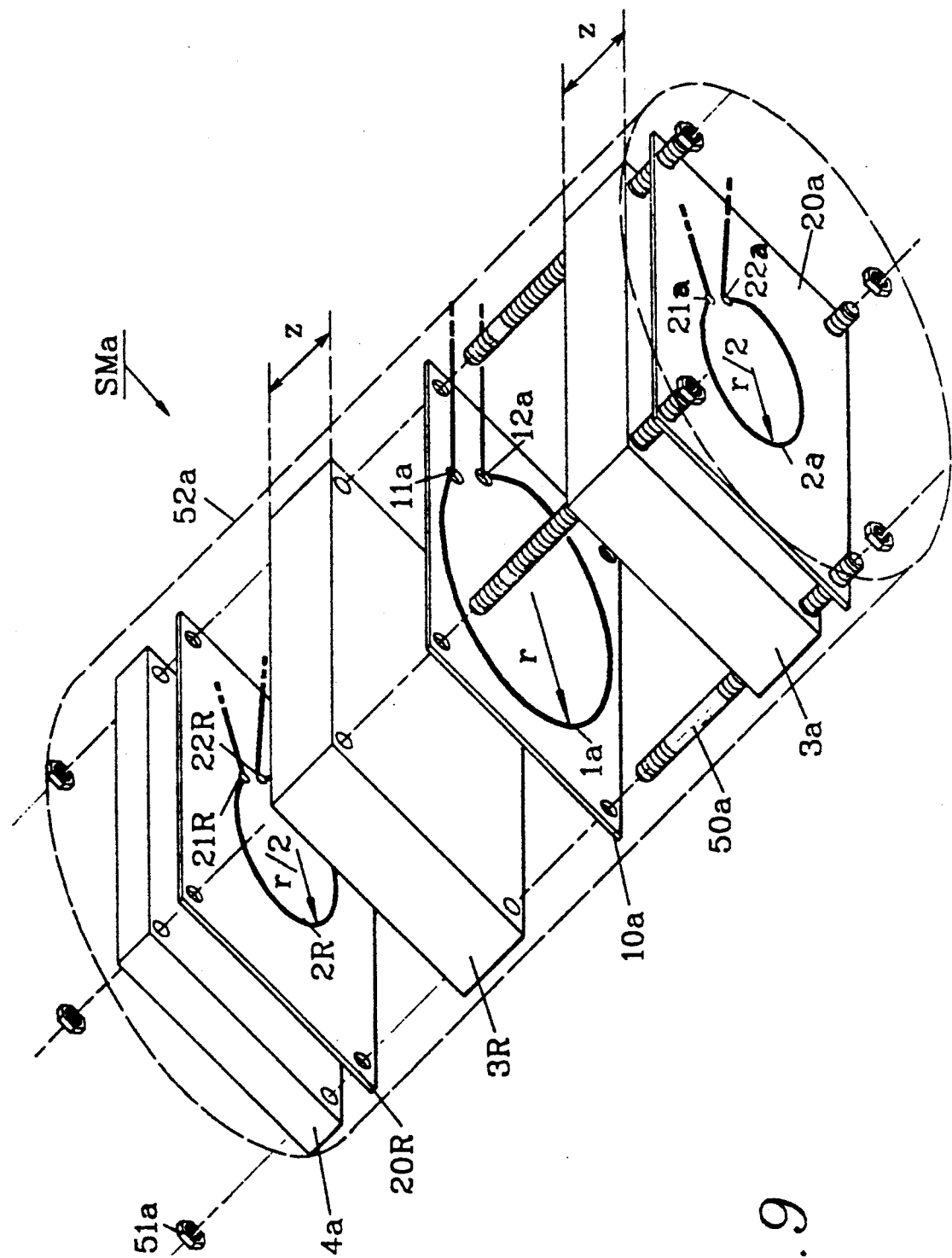
FIG. 9 is an exploded view in perspective of a second probe comprising three circular antennae.

In reference to FIG. 9, the probe SMa like the probe SM comprises the following stacked members, namely a printed board 20a supporting a preferably circular receiving antenna 2a, an insulating wedge 3a, a printed board 10a supporting a circular transmitting antenna 1a, and an insulating cover 4a. Furthermore, between the board 10a and the cover 4a, the probe SMa comprises a second insulating wedge 3R, and a third printed board 20R supporting a reference antenna 2R that is preferably circular. The board 20R is interposed between the cover 4a and the wedge 3R. The wedge 3R is applied against the board 10a. All the members of the probe SMa have the same section, e.g. square or disk-shaped in this instance, and are fastened to one another by means of four pairs of screws 50a and nuts 51a. Then the assembly of stacked members of the probe SMa is coated in resin 52a. For instance, the wedge 3R and the board 20R are respectively identical to the wedge 3a and the board 20a, and the radius of the reference antenna is equal to r/2.

The third antenna 2R in the probe SMa plays the same role as the reception antenna 2 in the probe SM during the first stage of the measurement method. In fact, when the side of the probe SMa comprising the antenna 2a is applied to a plate of material PM, the reference antenna 2R is situated opposite the plate PM by comparison with the center board 10a supporting the transmitting antenna 1a. The distance between the antenna 2R and the plate PM is then sufficiently large for the plate PM not to perturb the magnetic flux emitted by the antenna 1a and generating the voltage induced at terminals 21R and 22R of the antenna 2R.

Figure 10:
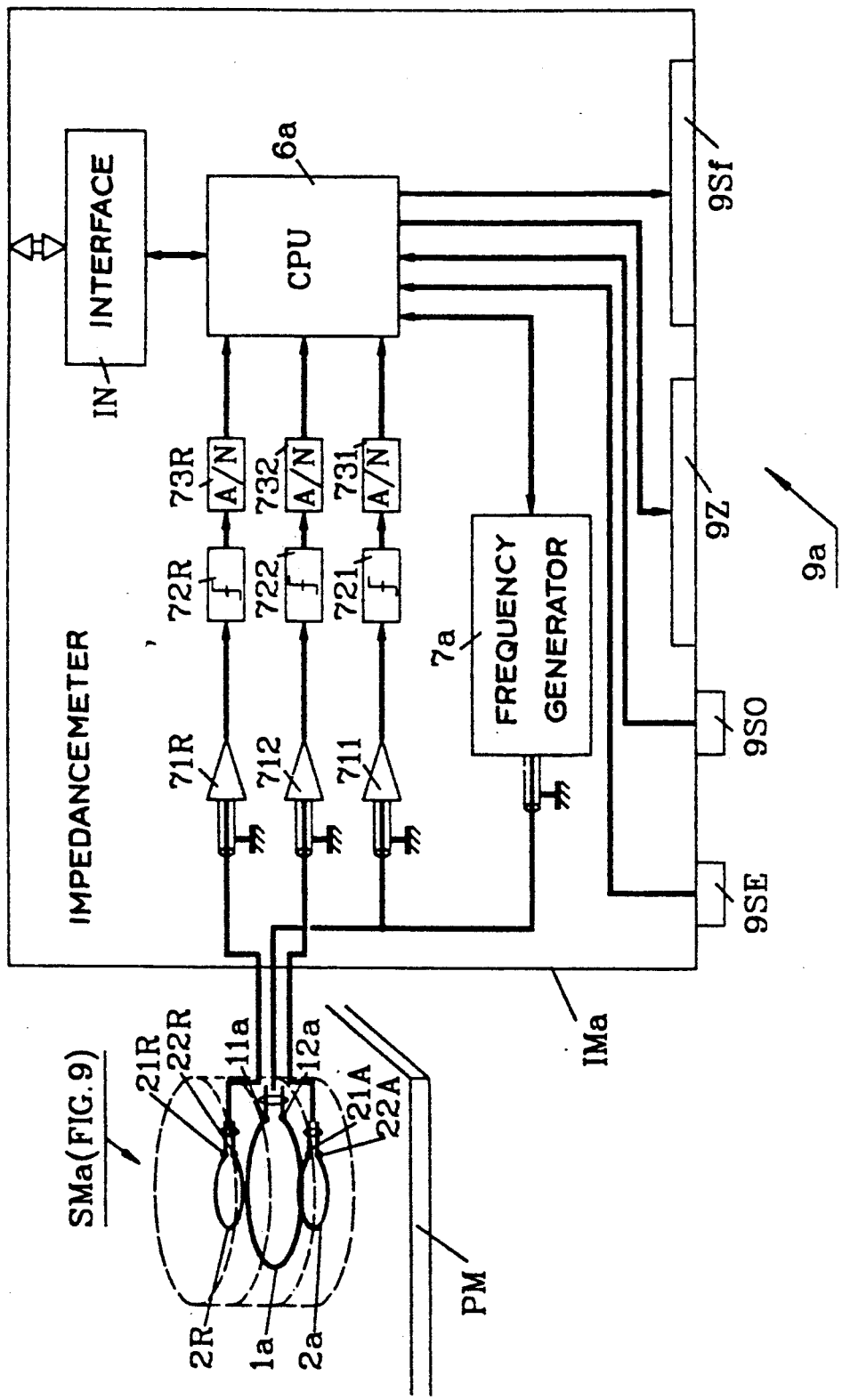
FIG. 10 is a block diagram of an impedancemeter operating with the probe in FIG. 9.
Figure 11:
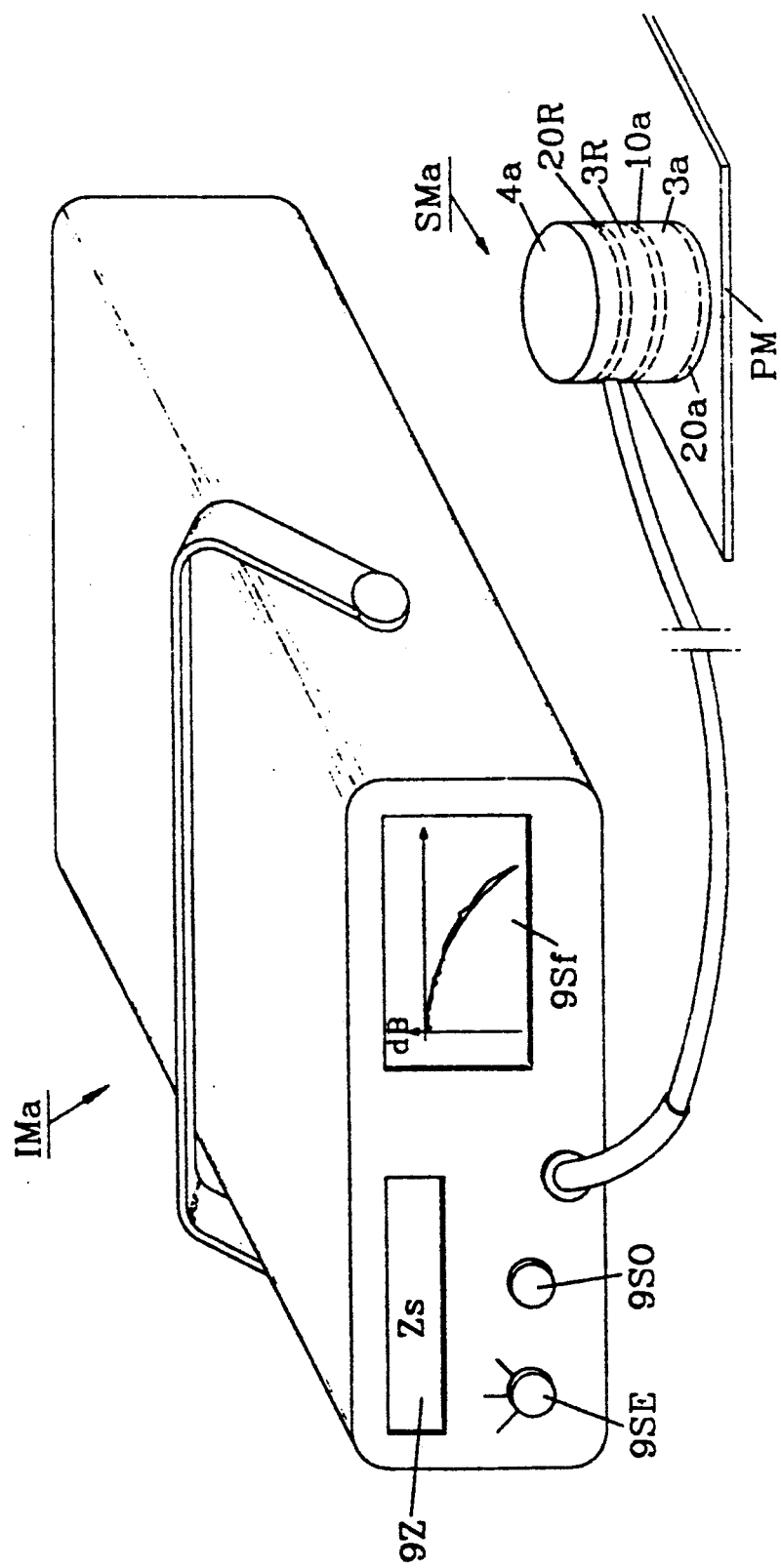
FIG. 11 is a schematic view in perspective of the impedancemeter in FIG. 10, in the form of a portable device.

As shown in FIGS. 10 and 11, the impedancemeter IMa also comprises a central processing unit 6a with an integrated microprocessor, a sine wave frequency generator 7a, and controlling and displaying means 9a.

The vectorial analyzer 8 is replaced in the impedancemeter IMa by three parallel assemblies each comprising in series an input amplifier 711, 712, 71R, an voltage limiting circuit 721, 722, 72R, and a analog-to-digital converter 731, 732 and 73R. The outputs of the generator 7a are connected to the terminals 11a and 12a of the transmitting antenna 1a and to the input terminals of the amplifier 711. The terminals 21a and 22a of the receiving and measuring antenna 2a and the terminals 21R and 22R of the receiving and reference antenna 2R are respectively connected to the input terminals of the amplifiers 712 and 71R. In these conditions, when the unit 6a orders a frequency sweep in a given range $f_{min}$ to $f_{max}$, the converters 731, 732 and 73R simultaneously transmit in digital form a voltage $V_1(f)$ applied to the terminals of the transmitting antenna 1a by the generator 7a, a voltage $V_2(f)$ induced in the antenna 2a depending on the impedance $Z_S$ of the material PM, and a reference voltage $V_R(f)$ induced in the antenna 73R. For each frequency f, the unit 6a directly calculates the ratio $S(f) = V_2/V_R$ which makes it possible to rapidly visualize the curve S(f) with the approaching curve $FBF_c$ on the screen 9Sf, and to display the digital value $Z_S$ of the material PM in a readout 9Z. Prior to measuring, the operator selects a frequency band [$f_{min}$, $f_{max}$] and consequently the impedance range $Z_S$ by means of a selector 9SE, and the type of probe by means of a button 9SO.

The impedancemeter IMa also comprises a standard interface IN with an RS 232C-type bidirectional telecommunications bus for exchanging digital signals with a remote calculator storing the curves and results obtained.

The impedancemeters described above apply to materials that can be represented by an isotropic surface impedance. Measurements are then interpreted quantitatively.

Figure 12:
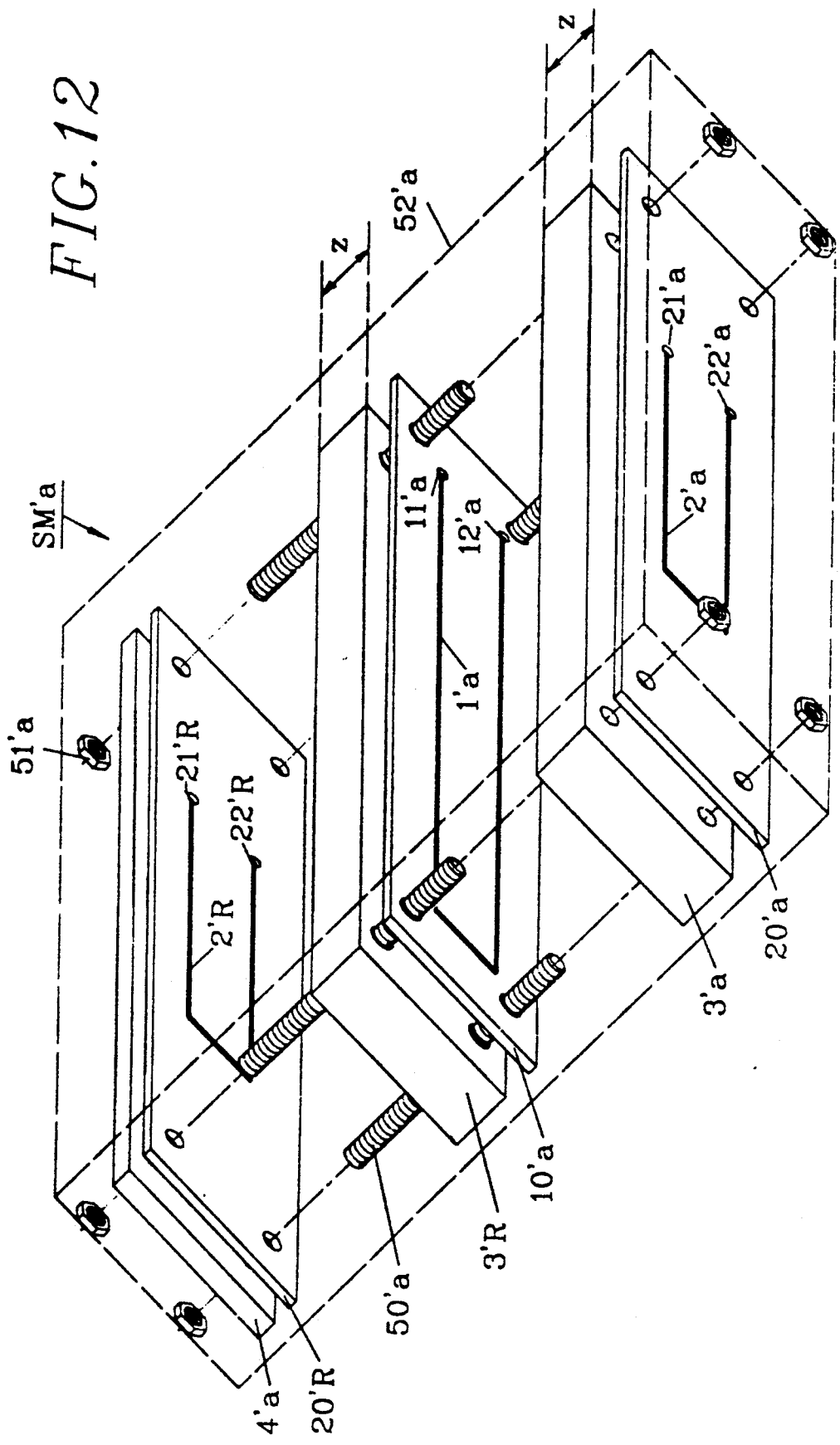
FIG. 12 is an exploded view in perspective of a probe comprising three rectangular antennae.

In the case of a highly anisotropic material, such as a carbon compound with parallel fibers, the surface impedance is comprised of an impedance $Z_{sx}$ in a direction x and of an impedance $Z_{sy}$ in a direction y perpendicular to the direction x. According to the invention, the circular antennae 1 and 2 in the probe SM, or the antennae 1a, 2a and 2R in the probe SMa are replaced by rectangularly looped antennae 1'a, 2'a and 2'R as shown in FIG. 12 for a probe SM'a. In this FIG. 12, members similar to those shown in FIG. 9 are designated by the same numeral references but accentuated. Each rectangular antenna is thus comprised of at least two longitudinal conductive wires connected at one of their ends by a conductive bend and having a length equal to at least 10 times the very small distance between these wires, in the region of a few millimeters. The two or three internal antenna in the probe are laid out in the same longitudinal direction x, as shown in FIG. 12.

If this rectangular-antenna probe is applied to the anisotropic material in the two perpendicular directions x and y, the impedancemeter displays two different curves $S_x(f)$ and $S_y(f)$ which enable the values of $Z_{sx}$ and $Z_{sy}$ to be deduced for the material under consideration. One of these two curves with the greatest attenuation corresponds to the case of the common longitudinal direction x of the probe antennae being parallel to the direction of the fibers, i.e. to the direction in which the conductivity of the material is best.

A probe embodying the invention is also capable of detecting any discontinuity in a material which, by nature, modifies the distribution of the magnetic field that generates the current induced in the receiving antenna. For instance, if the probe is applied to a slot existing between two plates comprised of the same material, the measurement supplied by the impedancemeter varies considerably and signals the presence of the slot. This phenomenon is accentuated when one chooses to use a probe with a rectangularly-looped receiving antenna placed on the slot.

Other material discontinuities may be detected, such as junctions between two plates of a same material. If the contact between these two plates is electrically perfect, the impedance measurement carried out by placing a probe on a plate junction should be identical to that of a uniform plate of this material; if the electrical contact at the junction is defective, the measurement is similar to that of a slot. A calibration enables the state of the electrical contact to be evaluated.

What is claim is:

1. A device for measuring the surface impedance of a material to be tested, said device comprising:
   a first antenna and a second antenna, said first and second antennae being superposed by an intermediary of a dielectric material to constitute a compact probe;
   means for deriving a first electrical voltage wobbled in frequency to be supplied to said first antenna whereby said first wobbled voltage produces a magnetic field emitted by said first antenna and crossing said second antenna;
   voltage measuring means for measuring second and third wobbled voltages supplied successively by said second antenna, said second wobbled voltage being induced in said second antenna responsive to said magnetic field when said probe is moved away from said material to be tested so that said material does not perturb said magnetic field, and said third wobbled voltage being induced in said second antenna responsive to said magnetic field when said probe is substantially placed on said material to be tested so that said material perturbs said magnetic field;
   means for calculating the variation of a ratio between said second and third wobbled voltages as a function of the frequency of said first wobbled voltage; and
   means for comparing said ratio variation with low-pass type functions respectively depending on predetermined surface impedances thereby selecting one of said low-pass type functions nearest said ratio variation to determine the surface impedance of said material to be tested.

2. The device as claimed in claim 1, wherein said probe comprises a spacing member of dielectric material with two parallel sides supporting said first and second antennae, respectively.

3. The device as claimed in claim 2, wherein said probe comprises an exterior dielectric coating on said second antenna at least so as to apply said probe against said material.

4. The device as claimed in claim 1, wherein said probe comprises a spacing member of dielectric material, and two thin support members of dielectric material that are respectively fixed on two parallel sides of said spacing member and on which are printed said first and second antennae, respectively.

5. The device as claimed in claim 4, wherein said probe comprises an exterior dielectric coating on said second antenna at least so as to apply said probe against said material.

6. The device as claimed in claim 1, wherein at least one of said first and second antennae is a circular loop.

7. The device as claimed in claim 1, wherein at least one of said first and second antennae is a rectangular loop.

8. The device as claimed in claim 1, wherein at least one of said first and second antennae is comprised of several concentric and/or superposed spires.

9. A device for measuring the surface impedance of a material to be tested, said device comprising:

first, second and third antennae, said first antenna being interposed between said second and third antennae by an intermediary of a dielectric material to constitute a compact probe;

means for deriving a first electrical voltage wobbled in frequency to be supplied to said first antenna whereby said first wobbled voltage produces a magnetic field emitted by said first antenna and crossing said second and third antennae;

voltage measuring means for measuring second and third wobbled voltages respectively supplied by said second and third antennae, said second and third wobbled voltages being respectively induced in said second and third antennae responsive to said magnetic field when a side of said probe including said second antenna is substantially placed on said material to be tested so that said material to be tested perturbs said magnetic field in the vicinity of second antenna and does not perturb said magnetic field in the vicinity of said third antenna;

means for calculating the variation of a ratio between said second and third wobbled voltages as a function of the frequency of said first wobbled voltage; and means for comparing said ratio variation with low-pass type functions respectively depending on pre-determined surface impedances thereby selecting one of said low-pass type functions nearest said ratio variation to determine the surface impedance of said material to be tested.

10. The device as claimed in claim 9, wherein said second and third antennae are symmetrical with regard to said first antenna in said probe.

11. The device as claimed in claim 9, wherein said probe comprises:

first, second and third thin support members of dielectric material which respectively support said first, second and third antennae, a first spacing member of dielectric material against two parallel sides of which said first and second support members are respectively fixed, and a second spacing member of dielectric material against two parallel sides of which said first and third support members are fixed.

* * * * *